United States Patent
Nagatomo

[11] Patent Number: 5,880,514
[45] Date of Patent: Mar. 9, 1999

[54] PROTECTION CIRCUIT FOR SEMICONDUCTOR DEVICE

[75] Inventor: Shigeru Nagatomo, Miyazaki, Japan

[73] Assignee: Oki Electric Industry Co., Ltd., Tokyo, Japan

[21] Appl. No.: 941,069

[22] Filed: Sep. 30, 1997

[30] Foreign Application Priority Data

Feb. 13, 1997 [JP] Japan .................................. 9-028589

[51] Int. Cl.$^6$ .................................................. H01L 29/00
[52] U.S. Cl. .............................................. 257/546; 361/91
[58] Field of Search ..................... 257/546, 355; 361/91

[56] References Cited

FOREIGN PATENT DOCUMENTS 0590520  4/1993  Japan ..................................... 257/546

*Primary Examiner*—Mark V. Prenty
*Attorney, Agent, or Firm*—Jones & Volentine, L.L.P.

[57] ABSTRACT

A protection circuit for a semiconductor device, the protection circuit being connected an input terminal of the semiconductor device in parallel with an internal circuit proper of the semiconductor device, comprising a semiconductor substrate having one conductivity, a first diffusion layer having the other conductivity produced along the top surface of the semiconductor substrate, a second diffusion layer having the other conductivity produced along the top surface of the first diffusion layer, the impurity concentration of the second diffusion layer being larger than that of the first diffusion layer, at least one third diffusion layer having one conductivity produced along the top surface of the semiconductor substrate and the first diffusion layer across the junction of the first diffusion layer, the impurity concentration being larger than that of the semiconductor substrate, an insulator film produced to cover a portion of the second and third diffusion layers and the first diffusion layer, a pair of insulator films produced to cover a portion of the remaining area of the third diffusion layers, an electrode arranged to contact the second diffusion layer and to cover the insulator layer covering the first diffusion layer, and the electrode being connected the input terminal and the internal circuit proper of the semiconductor device, whereby the protection circuit allows positive surge voltages to escape, and becomes durable against negative surge voltages.

12 Claims, 4 Drawing Sheets

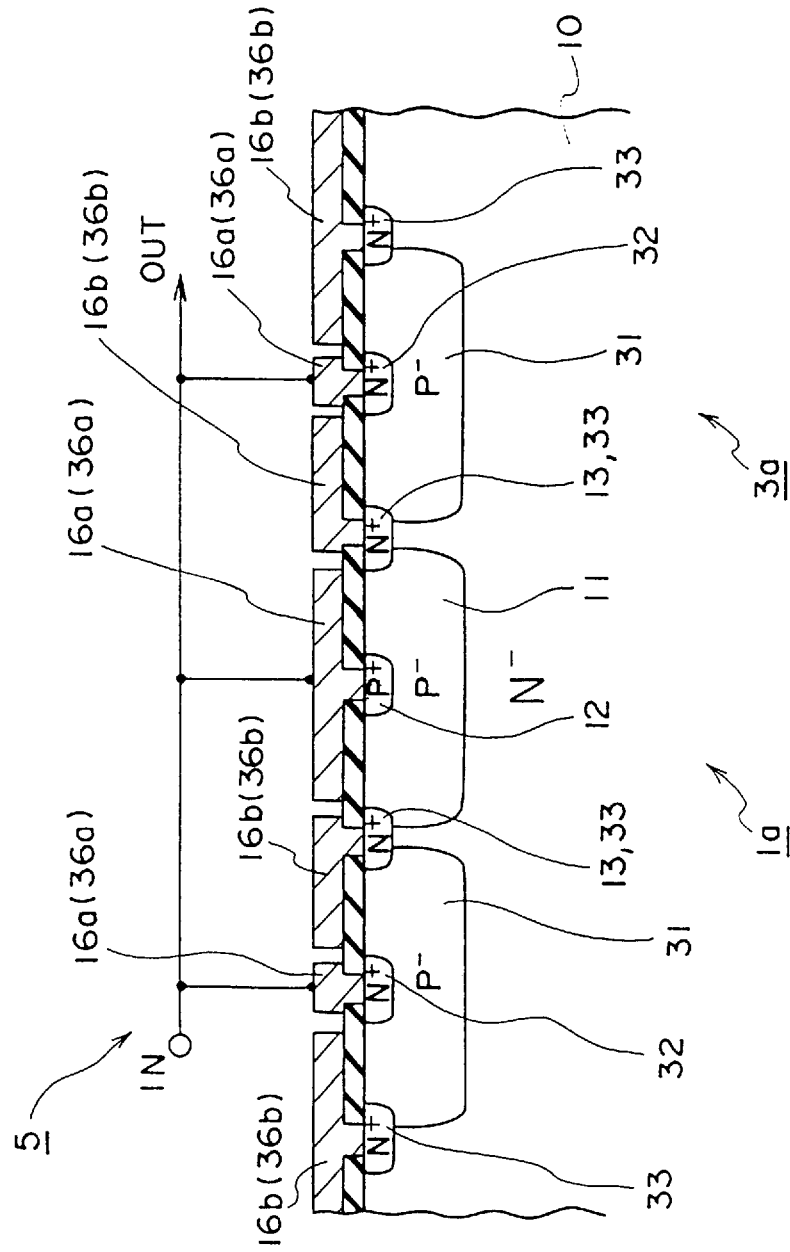

5,880,514

PROTECTION CIRCUIT FOR SEMICONDUCTOR DEVICE

FIELD OF THE INVENTION

This invention relates to a protection circuit for a semiconductor device, and more specifically to a protection circuit arranged between a terminal and an internal circuit proper of a semiconductor device for preventing breakdown of the internal circuit proper caused by electrostatic electricity generated therein, from occurring.

BACKGROUND OF THE INVENTION

A semiconductor integrated circuit available in the prior art is generally provided with a protection circuit arranged between a terminal and an internal circuit proper thereof for preventing breakdown of the internal circuit proper caused by electrostatic electricity generated therein, from occurring. An example of such protection circuits comprises diodes and resistors employed in combination, including a first diode which is a junction produced in an N-type semiconductor layer (Hereinafter such a junction is referred to as a P-type diffusion layer.) and a junction produced in a P-type semiconductor layer (Hereinafter such a junction is referred to as an N-type diffusion layer.).

For example, the first diode is arranged to connect its P-type diffusion layer with both the internal circuit and the terminal of the semiconductor integrated circuit, so as to allow a positive surge voltage applied to the terminal to bypass the P-type diffusion layer and to flow into the semiconductor substrate, thereby protecting the internal circuit proper from the positive surge voltage.

As for the second diode, its N-type diffusion layer is connected the internal circuit and the terminal, while its P-type diffusion layer is connected a low potential side. Consequently, a negative surge voltage applied to the terminal is allowed to bypass the N-type diffusion layer and to flow into the P-type diffusion layer, thereby protecting the internal circuit proper from the negative surge voltage.

In addition, resistors are connected respectively to the first and second diodes to protect the diodes from the surge voltages which are respectively applied thereto from the opposite directions.

In recent years, in conjunction with a trend towards higher integration of semiconductor devices, semiconductor devices are inclined to become smaller in size and the wirings are becoming more minute. In such advanced semiconductor devices which are enhanced in integration, the breakdown voltage characteristics with respect to surges such as the ones caused by discharge of electrostatic electricity, are tending to decline. However, even if advance is made to create a new-generation of semiconductor devices, surges applied thereto from the terminal do not decrease, and protection circuits are required to be provided with the characteristics for absorbing a certain range of excess voltage. In the protection circuits having the above-described circuit configuration, in order to maintain satisfactory characteristics, the diodes and the resistors require some dimension. For this reason, the horizontal area of the protection circuits inevitably increases to some extent. This is one parameter which hampers integration of semiconductor devices from being enhanced.

OBJECTS AND SUMMARY OF THE INVENTION

In view of the above-described environments, it is an object of this invention to provide a protection circuit which has an element realizing high efficiency in absorbing a forward surge voltage and is durable against a reverse surge voltage, and which is capable of reducing an area of the protection circuit for a semiconductor device, thereby overcoming the above-described drawbacks of the protection circuit for a semiconductor device available in the prior art.

To achieve the object, a protection circuit for a semiconductor device in accordance with this invention is provided with ingredients and configuration described below. Namely, this protection circuit for a semiconductor device has a first diffusion layer formed on the top surface of a semiconductor substrate. A second diffusion layer is provided on the top surface of the first diffusion layer. Further, a third diffusion layer is provided on the top surface of the aforementioned semiconductor substrate in such a manner as to extend across the vertical junction of first diffusion layer. The second diffusion layer is connected a first electrode which is connected both an internal circuit and a terminal which are formed on the semiconductor substrate.

In a protection circuit in accordance with a first embodiment of this invention, if the semiconductor substrate is provided with one conductivity, the first diffusion layer in the aforementioned element is provided with the other conductivity, the second diffusion layer is provided with the other conductivity and has a carrier concentration higher than the first diffusion layer, and the third diffusion layer is provided with one conductivity and has a carrier concentration higher than the semiconductor substrate. The entire top surface of the first diffusion layer and a part of the top surface of the second diffusion layer are covered by an insulator film, remaining the other part of the top surface of the second diffusion layer uncovered. The foregoing first electrode is arranged on the insulator film and on a part of the top surface of the second diffusion layer remained uncovered by the insulator film. Thus, the foregoing first electrode contacts the second diffusion layer and has a field effect to the first diffusion layer.

In the first protection circuit having the above-described configuration, since PN junctions are formed between the first diffusion layer and the semiconductor substrate and between the first diffusion layer and the third diffusion layer, respectively, the configuration functions as three independent diodes in which the current flows in the forward direction, i.e., in the direction from the first diffusion layer toward the substrate and in the direction from the first diffusion layer toward the third diffusion layer. In addition, since the wirings connected with the second diffusion layer are arranged on the top surface of the first diffusion layer via the insulator film, if a forward voltage is applied from the terminal to the second diffusion layer, the forward voltage is also applied to the electrode arranged on the first diffusion layer, so that the minority carriers are collected in the first diffusion layer along the lower surface of the insulator film. Accordingly, the current based on the forward voltage applied to the second diffusion layer flows from the first diffusion layer to the substrate and to the third diffusion layer.

On the other hand, if a reverse voltage is applied from the terminal to the second diffusion layer, the reverse voltage is also applied to the electrode arranged on the first diffusion layer, and the majority carriers are collected in the first diffusion layer along the lower surface of the insulator film. Accordingly, the breakdown voltage in that surface layer between the first diffusion layer and the third diffusion layer is lowered, with a result that the current based on the reverse voltage is allowed to flow out of the third diffusion layer. Hence, the above-described first protection circuit allows a forward surge voltage applied to the terminal to readily be expelled into the substrate, and the above-described first protection circuit is durable against an opposite surge voltage.

Furthermore, in a protection circuit in accordance with a second embodiment of this invention, if the semiconductor substrate is provided with one conductivity, the first diffusion layer in the above-described element is provided with the other conductivity, whereas the second and third diffusion layers are provided with the one conductivity and have carrier concentration higher than the semiconductor substrate.

In the second protection circuit having such configuration, a first PN junction is formed between the first diffusion layer and the second diffusion layer, and second PN junctions are formed between the first diffusion layer and the semiconductor substrate and between the first diffusion layer and the third diffusion layer, respectively. As a result, the configuration functions as a bipolar transistor. In addition, since the second diffusion layer and the third diffusion layer are connected the wirings commonly connected the terminal and the internal circuit of the semiconductor device, the first diffusion layer having the opposite conductivity to those of these diffusion layers electrically floats. For this reason, the breakdown voltage of the first PN junction and the breakdown voltage of the second PN junction are lower than those in a case where the first diffusion layer is fixed at a constant potential, so that the foregoing virtual bipolar transistor is inclined to be readily turned on.

Therefore, when a potential which is lower or higher than the potential of the semiconductor substrate (i.e., the potential at the third diffusion layer) is applied from the terminal to the second diffusion layer, the potential at the first diffusion layer which is floating, changes following the voltage applied to the second diffusion layer, and this first diffusion layer functions as an electrostatic capacity. For this reason, the time period until the transistor is turned on by application of a negative surge to the second diffusion layer is prolonged. Hence, the second protection circuit readily allows positive and negative surges to be expelled into the substrate, and the second protection circuit is durable against positive and negative surges.

BRIEF DESCRIPTION OF THE DRAWINGS

The above and other objects, features and advantages of this invention will become more apparent from the following detailed description of the invention when read in conjunction with the accompanying drawings, in which:

FIG. 6 is a schematic cross section of the protection circuit in accordance with the third embodiment of this invention, taken along the VI–VI' direction.

DETAILED DESCRIPTION OF THE PREFERRED EMBODIMENTS

Referring to the accompanying drawings, a detailed description will be presented below for protection circuits in accordance with three independent embodiments of this invention.

In the following description, a semiconductor layer having one conductivity is assumed to be an n-doped semiconductor layer, and a semiconductor layer having the other conductivity is assumed to be a p-doped semiconductor layer. Inversion of the conductivity is allowed for the protection circuit in accordance with this invention, subject to inversion of the polarity of the voltage applied thereto.
First Embodiment FIGS. 1 and 2 are schematic cross sections of protection circuits in accordance with a first embodiment of this invention, a forward surge voltage and a backward surge voltage being respectively applied to the protection circuit illustrated in FIG. 1 and to the protection circuit illustrated in FIG. 2.

Figure 1:
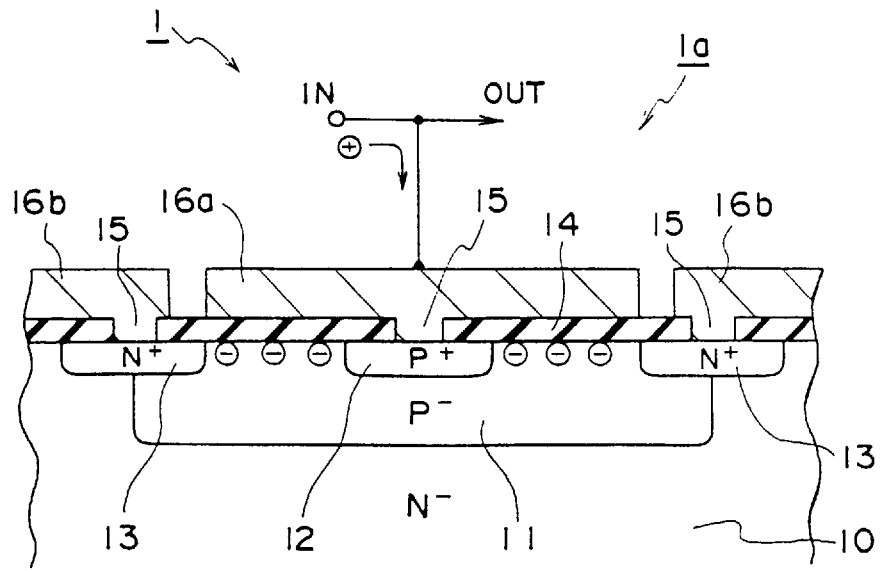
FIG. 1 is a schematic cross section of a protection circuit in accordance with a first embodiment of this invention, a forward surge voltage being applied to the protection circuit.
Figure 2:
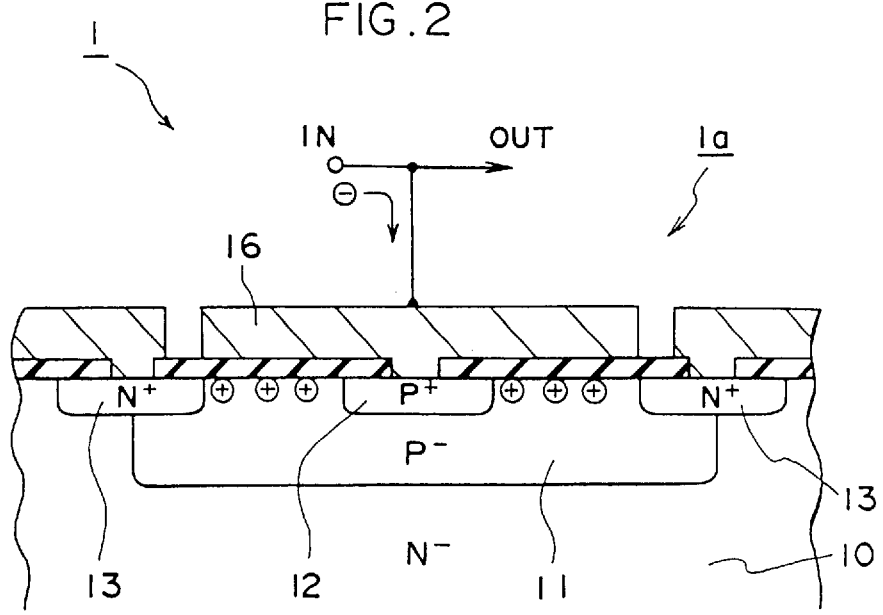
FIG. 2 is a schematic cross section of the protection circuit in accordance with the first embodiment of this invention, a backward surge voltage being applied to the protection circuit.

Referring to FIG. 1, an internal circuit (not shown) and input/output terminals (not shown) of a semiconductor device are provided on the unillustrated part of an N-type semiconductor substrate 10 on which a protection circuit 1 is also provided.

The protection circuit 1 is interposed between the terminal and the internal circuit, and is structured as follows.

Namely, the protection circuit 1 has an element 1a provided on the semiconductor substrate 10. This element 1a has a first diffusion layer 11 provided on the semiconductor substrate 10. A second diffusion layer 12 is provided in the surface layer of the first diffusion layer 11 in a substantially central region thereof. Further, a third diffusion layer 13 is produced on the semiconductor substrate 10 in such a manner as to extend across the semiconductor substrate 10 and the first diffusion layer 11. A space is intervened between the third diffusion layer 13 and the second diffusion layer 12.

The first diffusion layer 11 is of a P-type, and is formed, for example, in the same process for forming a P-well which constitutes a portion of transistors constituting the internal circuit.

The second diffusion layer 12 is of a P-type having a higher carrier concentration than the first diffusion layer 11, and is formed, for example, in the same process for forming sources and drains of p-channel field effect transistors provided in the internal circuit.

The second diffusion layer 12 is connected the internal circuit and the terminal by means of first wiring 16a via a contact hole 15 which is formed in such a manner as to penetrate an insulator film 14 covering the semiconductor substrate 10. The first wiring 16a is provided in such a manner as to cover an upper surface of the first diffusion layer 11 in a region where the second diffusion layer 12 is not formed. Here, it is important that the insulator film 14 is formed with a thickness of such an extent that carriers are collected in the surface layer of the first diffusion layer 11 in contact with the insulator film 14, when a voltage is applied to the first wiring 16a. As a result, the field effect of a voltage applied to the first wiring 16a readily extends to the first diffusion layer 11.

Further, the third diffusion layer 13 is of an N-type having a higher carrier concentration than the semiconductor substrate 10, and is formed in the same process for forming e.g. sources and drains of n-channel field effect transistors to be produced in the internal circuit.

In addition, a resistor (not shown), which is a constituent member of the protection circuit 1, is connected in series with second wiring 16b which is connected to the third diffusion layer 13 via the contact holes 15.

In the element 1a provided in the above-described protection circuit 1, PN junctions are formed between the first diffusion layer 11 and the semiconductor substrate 10 and between the first diffusion layer 11 and the third diffusion layer 13, respectively. Accordingly, this element 1a functions as a diode.

Next, a description will be presented below for the operation of the protection circuit 1 having the above-described configuration.

Referring to FIG. 1, firstly in a case where a positive surge voltage is applied to the terminal of the semiconductor device, as shown by the arrow in the drawing, a forward voltage is applied to the element 1a functioning as the diode. In this case, the positive surge voltage is applied to the second diffusion layer 12 connected to the terminal. The positive surge voltage is also applied to the first wiring 16a facing the first diffusion layer 11 via the insulator film 14. Then, electrons (i.e. the minority carriers) in the first diffusion layer 11 are collected along the lower surface of the insulator film 14, and the positive surge voltage applied to the second diffusion layer 12 is attracted by the N-type third diffusion layer 13. The positive surge voltage applied to the second diffusion layer 12 is allowed to escape efficiently to the semiconductor substrate 10 by virtue of this attraction effect.

Referring to FIG. 2, in a case where a negative surge voltage is applied to the terminal of the semiconductor device, a reverse voltage is applied to the element 1a. In this case, the negative surge voltage is applied to the second diffusion layer 12 connected to the terminal. Further, the negative surge voltage is also applied to the first wiring 16a facing the first diffusion layer 11 via the insulator film 14, and holes (i.e. the majority carriers) in the first diffusion layer 11 are collected along the lower surface of the insulator film 14. Then, the breakdown voltage of the PN junction between the first diffusion layer 11 and the third diffusion layer 13 declines in that surface layer of the first diffusion layer 11, and the diode constituted by the element 1a is quickly turned on. Then, the negative surge is allowed to escape from the third diffusion layer 13 to the semiconductor substrate 10.

Consequently, the above-described element 1a readily allows positive surges to escape, and becomes durable with respect to negative surges. For this reason, the characteristics in which the element 1a absorbs positive surges is improved. This makes it possible to reduce the area where the element 1a is formed, and to reduce the area where an element (e.g., a resistor) for protecting the element 1a from negative surges is formed.

Second Embodiment

Figure 3:
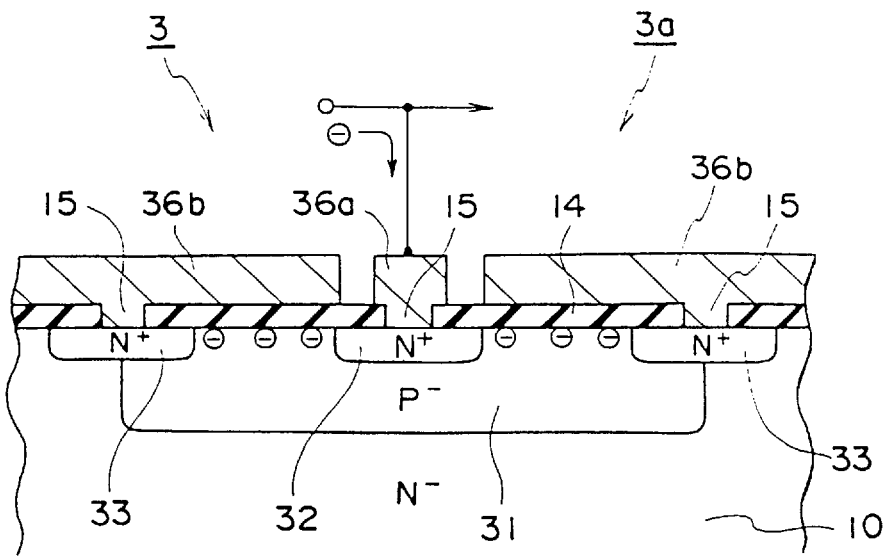
FIG. 3 is a schematic cross section of a protection circuit in accordance with a second embodiment of this invention, a forward surge voltage being applied to the protection circuit.
Figure 4:
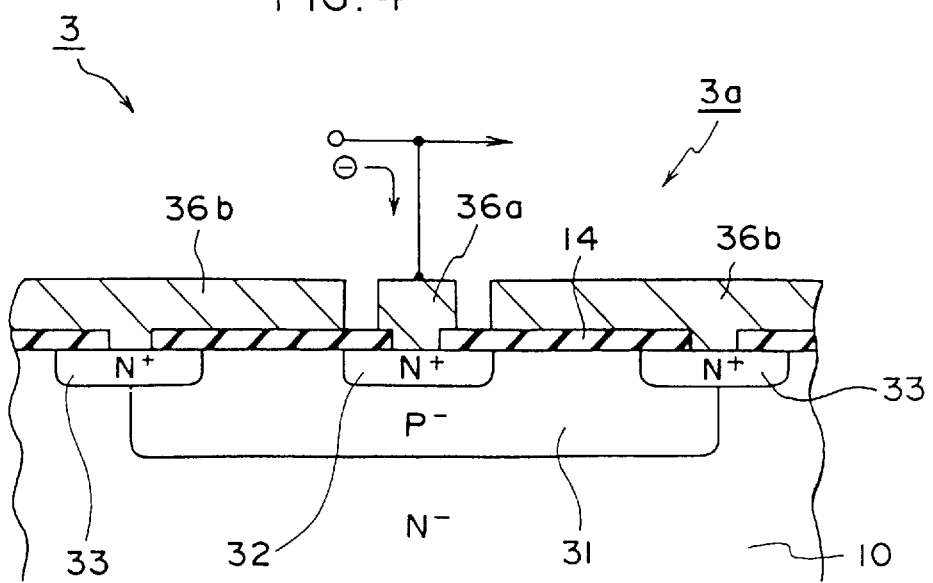
FIG. 4 is a schematic cross section of the protection circuit in accordance with the second embodiment of this invention, a backward surge voltage being applied to the protection circuit.

FIGS. 3 and 4 are schematic cross sections of protection circuits in accordance with a second embodiment of this invention, a forward surge voltage and a backward surge voltage being respectively applied to the protection circuit shown in FIG. 3 and to the protection circuit shown in FIG. 4.

The difference between a protection circuit 3 in accordance with the second embodiment shown here and the protection circuit 1 in accordance with the above-described first embodiment, lies in the configuration of an element 3a provided in the protection circuit 3, and particularly in the conductivity of diffusion layers in the element 3a and the layout of the wiring connected to these diffusion layers.

Referring to FIG. 3, in the element 3a provided in the protection circuit 3, a first diffusion layer 31 provided in the semiconductor substrate 10 is of the P-type, and a second diffusion layer 32 provided in the surface layer at a substantially central region of the first diffusion layer 31 is of the N-type. Further, a third diffusion layer 33 provided at a peripheral region of the first diffusion layer 31 across the junction between the first diffusion layer 31 and the semiconductor substrate 10, is of the N-type.

In addition, the second diffusion layer 32 is connected the internal circuit and the terminal by means of a first wiring 36a produced in a contact hole 15 which is formed in such a manner as to penetrate the insulator film 14 covering the semiconductor substrate 10.

The second wiring 36b is connected the third diffusion layer 33 via the contact holes 15. The second wiring 36b is provided in such a manner as to cover an insulator layer 14 which further covers the upper surface of the first diffusion layer 31. Here, a resistor (not shown) which is a constituent member of the protection circuit 3, is connected in series with second wiring 36b.

In the element 3a provided in the above-described protection circuit 3, first PN junctions are formed between the first diffusion layer 31 and the semiconductor substrate 10 and between the first diffusion layer 31 and the third diffusion layer 33, respectively, and a second PN junction is similarly formed between the first diffusion layer 31 and the second diffusion layer 32. Accordingly, this element 3a functions as a virtual bipolar transistor whose base is the first diffusion layer 31. Further, since the first diffusion layer 31, which is solely of the P-type, is connected nowhere, the first diffusion layer 31 floats electrically.

Next, a description will be presented below for the operation of the protection circuit 3 having the above-described configuration.

Referring to FIG. 3, first, in a case where a negative surge voltage lower than the potential of the semiconductor substrate 10 (i.e., the potential of the third diffusion layer 33) is applied to the terminal of the semiconductor device, as shown by the arrow in the drawing, the negative surge voltage is applied to the second diffusion layer 32 connected to the terminal, and the negative surge voltage is applied from the second diffusion layer 32 to the first diffusion layer 31. Here, since the first diffusion layer 31 is in the floating state, the potential at the first diffusion layer 31 changes, following the voltage applied to the second diffusion layer 32. As a result, this first diffusion layer 31 functions as an electrostatic capacity. For this reason, the time period until the element 3a is turned on as a virtual bipolar a transistor which virtually comprises the second diffusion layer 32, the second diffusion layer 31 and the third diffusion layer 33, upon application of the negative voltage to the second diffusion layer 32 is prolonged.

In addition, since the first diffusion layer 31 is in the floating state, the breakdown voltage of the first PN junction and the breakdown voltage of the second PN junction produced in the above-described element 3a are lower than those in the case where the potential of the first diffusion layer 31 is fixed at constant potential. For this reason, the element 3a is quickly turned on as the foregoing virtual bipolar transistor upon application of a negative surge voltage thereto, and the negative surge applied to the second diffusion layer 32 is allowed to escape from the third diffusion layer 33 to the semiconductor substrate 10.

Moreover, since the first diffusion layer 31 of the element 3a is covered by the second wiring 36b, the potential of the second wiring 36b shifts to positive potential, when a negative surge is applied to the first diffusion layer 31 in the above-described manner. Consequently, electrons are collected along the lower surface of the insulator film 14 below the second wiring 36b i.e. in the surface layer of the first diffusion layer 31. For this reason, the above-described element 3a is quickly turned on as a quasi-field effect transistor whose gate electrode is the second wiring 36b and whose source and drain are respectively the second diffusion layer 32 and the third diffusion layer 33. Therefore, the negative surge voltage applied to the second diffusion layer 32 is allowed to escape more quickly.

Referring to FIG. 4, in a case where a positive surge voltage higher than the potential of the semiconductor substrate 10 (i.e. the potential of the third diffusion layer 33) is applied to the terminal of the semiconductor device, the positive surge voltage is applied to the second diffusion layer 32, and the potential of the first diffusion layer 31 changes. As a result, the first diffusion layer 31 functions as an electrostatic capacity. For this reason, the time period until the element 3a is turned on as a transistor upon application of the positive surge to the second diffusion layer 32 is prolonged. Moreover, since the first diffusion layer 31 is in the floating state, the element 3a is quickly turned on as a transistor upon application of the positive surge voltage thereto. Therefore, the positive surge applied to the second diffusion layer 32 is allowed to escape quickly from the third diffusion layer 33 to the semiconductor substrate 10.

As described above, the element 3a readily allows both the negative surge voltage and the positive surge voltage to escape, and is particularly, resistive against a negative surge voltage. At the same time, the element 3a is durable against negative and positive surges. For this reason, the characteristics to absorb surge voltages is sizably improved for the element 3a. Therefore, the horizontal area of the element 3a is reduced and the dimension of an element (e.g. a resistor) employable for protection of the element 3a from a surge voltage, is also sizably decreased.

In the above-described second embodiment, the second wiring 36b connected the third diffusion layer 33 is arranged on the insulator layer 14 which is arranged on the top surface of the first diffusion layer 31. The second wiring 36b arranged on the insulator layer 14 which is arranged on the top surface of the first diffusion layer 31, however, can be replaced by the first wiring connected the second diffusion layer 32. In this case, if a negative surge voltage is applied to the terminal, the negative surge voltage is applied to the first wiring 36a arranged on the insulator layer 14 which is arranged on the first diffusion layer 31. As a result, holes are collected at the surface of the first diffusion layer 31 below the insulator film 14. As a result, the breakdown voltage of a first PN junction and the breakdown voltage of a second PN junction both of which are rather low, because the first diffusion layer 31 floats, become lower, because holes gather along the surface of the first diffusion layer 31. Consequently, similarly to the above-described first embodiment, the element 3a is inclined to be readily turned on as a transistor upon application of a negative voltage thereto, thereby allowing a negative surge voltage to escape.

Third Embodiment

Figure 5:
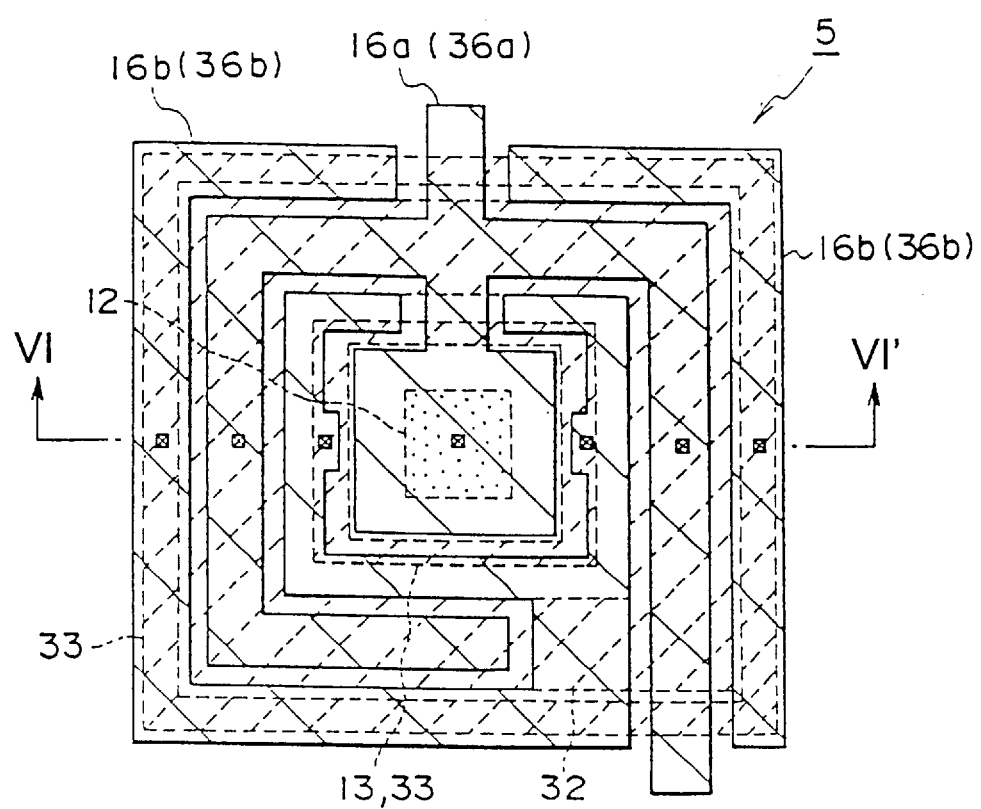
FIG. 5 is a plan view of a protection circuit in accordance with a third embodiment of this invention.

FIG. 5 is a plan view of a protection circuit in accordance with a third embodiment of this invention, and FIG. 6 is a schematic cross section, taken along the direction shown by VI–VI' in FIG. 5, of the protection circuit in accordance with the third embodiment of this invention.

A protection circuit 5 in accordance with the third embodiment shown in these drawings is a combination of the protection circuit in accordance with the first embodiment and the protection circuit in accordance with the second embodiment, the combination being produced in one semiconductor substrate 10.

Referring to FIGS. 5 and 6, the element 1a provided in the protection circuit in accordance with the first embodiment is used as a first element 1a, and the element 3a provided in the protection circuit in accordance with the second embodiment is used as a second element 3a. Further, the first diffusion layer 31 in the second element 3a is used as a fourth diffusion layer 31, the second diffusion layer 32 is used as a fifth diffusion layer 32, and the third diffusion layer 33 is used as a sixth diffusion layer 33. In addition, in the first element 1a and in the second element 3a, the third diffusion layer 13 in the first element 1a and the sixth diffusion layer 33 in the second element 3a are constituted by an identical diffusion layer. In other words, the third diffusion layer 13 in the first element 1a and the sixth diffusion layer 33 in the second element 3a are produced in the one step. Further, the first element 1a and the second element 3a are connected in parallel between the terminal and the internal circuit in the semiconductor device by means of a first wiring 16a (36a) which is shared by the first element 1a and the second element 3a.

In the protection circuit 5 having the above-described configuration, since the first element 1a and the second element 3a are connected in parallel between the terminal and the internal circuit of the semiconductor device, the advantages of the first embodiment and the second embodiment are combined. Namely, in the protection circuit 5 having the above-described configuration, a positive surge voltage applied to the terminal is allowed to escape efficiently by means of the first element 1a. Incidentally, a negative surge voltage applied to the terminal is allowed to escape efficiently by means of the second element 3a. For this reason, the protection circuit 5 allows the positive and negative surge voltages to escape efficiently. As a result, it is possible to reduce the area where the first element 1a and the second element 3a constituting the protection circuit 5 for protecting the semiconductor device from surges is formed.

Further, the first element 1a is highly resistive against negative surges, while the second element 3a is highly resistive against both positive and negative surges. For this reason, it is possible to reduce the dimension of a resistor for protecting the first element 1a from a positive surge and a resistor for protecting the second element 3a from positive and negative surges. Moreover, in the above-described protection circuit, since a part of the diffusion layer is shared by the first element 1a and the second element 3a, it is possible to further reduce the area where the first element 1a and the second element 3a are formed.

The foregoing description has clarified that this invention has successfully provided a protection circuit for a semiconductor device having an enhanced function to prevent both forward and backward surge voltages from entering into the internal circuit proper of a semiconductor device without requiring a larger area on a semiconductor substrate.

What is claimed is:

1. A protection circuit for a semiconductor device, said protection circuit being connected with an input terminal of said semiconductor device in parallel with an internal circuit of said semiconductor device, comprising:
   a semiconductor substrate having a first conductivity,
   a first diffusion layer having a second conductivity, disposed along a top surface of said semiconductor substrate,
   a second diffusion layer having the second conductivity, disposed along a top surface of said first diffusion layer, an impurity concentration of said second diffusion layer being larger than an impurity concentration of said first diffusion layer,
   at least one a third diffusion layer having the first conductivity, disposed along the top surface of said semiconductor substrate and along the top surface of said first diffusion layer, across a junction between said first diffusion layer and said semiconductor substrate, an impurity concentration of said third diffusion layer being larger than an impurity concentration of said semiconductor substrate, and a first insulator film, arranged to cover a portion of said second and third diffusion layers and said first diffusion layer.

2. A protection circuit for a semiconductor device in accordance with claim 1, further comprising:

at least one second insulator film arranged to cover a portion of said third diffusion layer which is not covered by said first insulator film.

3. A protection circuit for a semiconductor device in accordance with claim 1, further comprising:

an electrode, arranged to contact said second diffusion layer and to cover said first insulator film covering said first diffusion layer, said electrode being connected with said input terminal and said internal circuit of said semiconductor device.

4. A protection circuit for a semiconductor device in accordance with claim 1, further comprising:

at least one electrode, arranged to contact said third diffusion layer.

5. A protection circuit for a semiconductor device, said protection circuit being connected with an input terminal of said semiconductor device in parallel with an internal circuit of said semiconductor device, comprising:

a semiconductor substrate having a first conductivity, a first diffusion layer having a second conductivity, disposed along a top surface of said semiconductor substrate, said first diffusion layer being electrically floating, a second diffusion layer having the first conductivity, disposed along a top surface of said first diffusion layer, the impurity concentration of said second diffusion layer being larger than that of said semiconductor substrate, at least one third diffusion layer having the first conductivity, disposed along the top surface of said semiconductor substrate and of said first diffusion layer, across a junction between said first diffusion layer and said semiconductor substrate, an impurity concentration of said third diffusion layer being larger than an impurity concentration of said semiconductor substrate, and a first insulator film arranged to cover a portion of said second and third diffusion layers and said first diffusion layer.

6. protection circuit for a semiconductor device in accordance with claim 5, further comprising:

at least one second insulator film arranged to cover a portion of said third diffusion layer which is not covered by said first insulator film.

7. A protection circuit for a semiconductor device in accordance with claim 5, further comprising:

an electrode, arranged to contact said second diffusion layer, said electrode being connected with said input terminal and said internal circuit of said semiconductor device.

8. A protection circuit for a semiconductor device in accordance with claim 5, further comprising:

at least one electrode produced to contact a portion of said third diffusion layer and to cover said first insulator film covering said first diffusion layer.

9. A protection circuit for a semiconductor device, said protection circuit being connected with an input terminal of said semiconductor device in parallel with an internal circuit of said semiconductor device, comprising:

a semiconductor substrate having a first conductivity, a first diffusion layer having a second conductivity, disposed along a top surface of said semiconductor substrate, a second diffusion layer having the second conductivity, disposed along a top surface of said first diffusion layer, an impurity concentration of said second diffusion layer being larger than an impurity concentration of said first diffusion layer, at least one third diffusion layer having the first conductivity, disposed along the top surface of said semiconductor substrate and of said first diffusion layer, across a junction between said first diffusion layer and said semiconductor substrate, an impurity concentration of said third diffusion layer being larger than an impurity concentration of said semiconductor substrate, a first insulator film arranged to cover a portion of said second and third diffusion layers and said first diffusion layer, a fourth diffusion layer having the second conductivity, disposed along the top surface of said semiconductor substrate, a fifth diffusion layer having the first conductivity, disposed along a top surface of said fourth diffusion layer, an impurity concentration of said fifth diffusion layer being larger than the impurity concentration of said semiconductor substrate, a sixth diffusion layer having the first conductivity, disposed along the top surface of said semiconductor substrate and said fourth diffusion layer, across a junction between said fourth diffusion layer and said semiconductor substrate an impurity concentration of said sixth diffusion layer being larger than the impurity concentration of said semiconductor substrate, and a second insulator film arranged to cover a portion of said fifth and sixth diffusion layers and said fourth diffusion layer.

10. A protection circuit for a semiconductor device in accordance with claim 9, further comprising:

at least one third insulator film arranged to cover a portion of said third diffusion layer which is not covered by said first insulator film, and at least one fourth insulator film arranged to cover a portion of said sixth diffusion layer which is not covered by said second insulator film.

11. A protection circuit for a semiconductor device in accordance with claim 9, further comprising:

a first electrode, arranged to contact said second diffusion layer and to cover said first insulator film covering said first diffusion layer, said first electrode being connected with said input terminal and said internal circuit of said semiconductor device, and a second electrode, arranged to contact said fifth diffusion layer, said second electrode being connected with said input terminal and said internal circuit of said semiconductor device.

12. A protection circuit for a semiconductor device in accordance with claim 9, further comprising:

at least one first electrode arranged to contact said third diffusion layer, and at least one second electrode arranged to contact a portion of said sixth diffusion layer and to cover said second insulator film covering said fourth diffusion layer.

\* \* \* \* \*